United States Patent [19]
Lombardi

[11] Patent Number: 6,061,575
[45] Date of Patent: *May 9, 2000

[54] FREQUENCY SYNTHESIZER CIRCUIT FOR MOBILE STATIONS

[75] Inventor: Frank Thomas Lombardi, Durham, N.C.

[73] Assignee: Ericsson Inc., Research Triangle Park, N.C.

[*] Notice: This patent issued on a continued prosecution application filed under 37 CFR 1.53(d), and is subject to the twenty year patent term provisions of 35 U.S.C. 154(a)(2).

[21] Appl. No.: 08/744,537

[22] Filed: Nov. 6, 1996

[51] Int. Cl.⁷ ........................................ H04B 1/38
[52] U.S. Cl. ...................... 455/552; 455/76; 455/209; 455/315
[58] Field of Search ................... 455/552, 553, 455/74, 76, 86, 112, 209, 315, 314

[56] References Cited

U.S. PATENT DOCUMENTS

| | | | |
|---|---|---|---|
| 4,360,788 | 11/1982 | Erps et al. | 331/1 |
| 4,459,560 | 7/1984 | Kurihara | 331/2 |
| 4,972,455 | 11/1990 | Phillips et al. | 455/552 |
| 5,008,925 | 4/1991 | Pireh | 455/552 |
| 5,020,092 | 5/1991 | Phillips et al. | 455/76 |
| 5,020,093 | 5/1991 | Pireh | 445/552 |
| 5,146,186 | 9/1992 | Vella | 331/16 |
| 5,175,872 | 12/1992 | Borrass | 455/76 |
| 5,406,615 | 4/1995 | Miller, II et al. | 455/552 |
| 5,451,910 | 9/1995 | Guthrie | 331/16 |
| 5,465,409 | 11/1995 | Boprras et al. | 455/76 |
| 5,475,677 | 12/1995 | Arnold et al. | 455/552 |
| 5,483,679 | 1/1996 | Sasaki | 455/76 |
| 5,511,235 | 4/1996 | Duong et al. | 455/76 |
| 5,511,236 | 4/1996 | Umstattd et al. | 455/76 |
| 5,519,885 | 5/1996 | Vaisanen | 455/76 |
| 5,535,432 | 7/1996 | Dent | 455/76 |
| 5,564,076 | 10/1996 | Auvray | 455/553 |
| 5,603,097 | 2/1997 | Kanou | 455/76 |
| 5,640,686 | 6/1997 | Norimatsu | 455/552 |
| 5,732,330 | 3/1998 | Anderson et al. | 455/76 |
| 5,734,970 | 3/1998 | Saito | 455/76 |
| 5,822,373 | 10/1998 | Addy | 375/259 |
| 5,991,605 | 11/1999 | Rapeli | 455/76 |

FOREIGN PATENT DOCUMENTS

| | | |
|---|---|---|
| 0 398 688 A2 | 11/1990 | European Pat. Off. . |
| 0 541 305 A1 | 5/1993 | European Pat. Off. . |
| 0 678 974 A2 | 10/1995 | European Pat. Off. . |
| 678 974 A2 | 10/1995 | European Pat. Off. ......... H03D 7/16 |
| 0 720 310 A1 | 7/1996 | European Pat. Off. . |

OTHER PUBLICATIONS

Couch, Leon W. Digital and Analog Communication Systems, 1990 pp. 256–257, 1990.

*Primary Examiner*—Reinhard J. Eisenzopf
*Assistant Examiner*—Charles N. Appiah
*Attorney, Agent, or Firm*—Robert A. Samra

[57] ABSTRACT

In general, the present invention provides a low cost mechanism for reducing the settling time and/or improving the phase noise performance of a frequency synthesizer in a mobile station. In one embodiment, the present invention eliminates the need for using two transmit offset synthesizers in a mobile station which must be able to operate on two different frequency bands characterized by different transmit-receive (TX-RX) channel separation. According to the present invention, one or both of the transmit offset synthesizers may be eliminated by deriving an appropriate transmit offset signal from an auxiliary synthesizer in the mobile station through a relatively simple and inexpensive frequency scaling circuit (e.g., frequency divider or multiplier), and by using a fast settling main channel synthesizer to hop between two different frequencies when the mobile station is switching between transmitting and receiving, respectively.

32 Claims, 6 Drawing Sheets

FREQUENCY SYNTHESIZER CIRCUIT FOR MOBILE STATIONS

BACKGROUND OF THE INVENTION

1. Field of the Invention

The present invention relates to mobile stations which operate in wireless communication systems and, more particularly, to certain improvements allowing for more rapid settling and/or better phase noise performance of frequency synthesizers used in such mobile stations.

2. Related Prior Art Systems

The prior art includes cellular radio systems which have been operating in the United States since the early 1980s, and providing telephone service to an ever growing subscriber base, presently estimated at over 20 million subscribers. Cellular telephone service operates much like the fixed, wireline telephone service in homes and offices, except that radio frequencies rather than telephone wires are used to connect telephone calls to and from the mobile subscribers. Each mobile subscriber is assigned a private (10 digit) directory telephone number and is usually billed based on the amount of "airtime" he or she spends talking on the cellular telephone each month. Many of the service features available to landline telephone users (e.g., call waiting, call forwarding, three-way calling, etc.) are also generally available to mobile subscribers.

In the United States, cellular operating licenses have been awarded by the Federal Communications Commission (FCC) pursuant to a licensing scheme which divided the country into geographic service markets defined according to the 1980 Census. The major metropolitan markets are called metropolitan statistical areas (MSAs) while the smaller rural markets are called rural statistical areas (RSAs). Only two cellular licenses are awarded for operating systems in each market. These two systems, which are commonly referred to as the "A-system" and the "B-system," respectively, are assigned different radio frequency (RF) bands (blocks) in the 800 MHz range. Mobile subscribers have the freedom to subscribe to service from either the A-system or the B-system operator (or both). The local system from which service is subscribed is called the "home" system. When travelling outside the home system, a mobile subscriber may be able to obtain service in a distant system if there is a "roaming" agreement between the operators of the home and "visited" systems.

The architecture for a typical cellular radio system is shown in FIG. 1. A geographical area (e.g., a metropolitan area) is divided into several smaller, contiguous radio coverage areas, called "cells," such as cells C1–C10. The cells C1–C10 are served by a corresponding group of fixed radio stations, called "base stations," B1–B10, each of which includes a plurality of RF channel units (transceivers) that operate on a subset of the RF channels assigned to the system, as well known in the art. For illustration purposes, the base stations B1–B10 are shown in FIG. 1 to be located at the center of the cells C1–C10, respectively, and are shown to be equipped with omni-directional antennas transmitting equally in all directions. However, the base stations B1–B10 may also be located near the periphery or otherwise away from the centers of the cells C1–C10, and may illuminate the cells C1–C10 with radio signals directionally (e.g., a base station may be equipped with three directional antennas each covering a 120 degrees sector).

The RF channels allocated to any given cell (or sector) may be reallocated to a distant cell in accordance with a frequency reuse plan as is well known in the art. In each cell (or sector), at least one RF channel is used to carry control or supervisory messages, and is called the "control" or "paging/access" channel. The other RF channels are used to carry voice conversations, and are called the "voice" or "speech" channels. The cellular telephone users (mobile subscribers) in the cells C1–C10 are provided with portable (hand-held), transportable (hand-carried) or mobile (car-mounted) telephone units, collectively referred to as "mobile stations," such as mobile stations M1–M5, each of which communicates with a nearby base station. Each of the mobile stations M1–M5 includes a controller (microprocessor) and a transceiver, as well known in the art. The transceiver in each mobile station may tune to any of the RF channels specified in the system (whereas each of the transceivers in the base stations B1–B10 usually operates on only one of the different RF channels used in the corresponding cell).

With continuing reference to FIG. 1, the base stations B1–B10 are connected to and controlled by a mobile telephone switching office (MTSO) 20. The MTSO 20, in turn, is connected to a central office (not specifically shown in FIG. 1) in the landline (wireline) public switched telephone network (PSTN) 22, or to a similar facility such as an integrated system digital network (ISDN). The MTSO 20 switches calls between wireline and mobile subscribers, controls signalling to the mobile stations M1–M5, compiles billing statistics, stores subscriber service profiles, and provides for the operation, maintenance and testing of the system.

Access to the cellular system of FIG. 1 by any of the mobile stations M1–M5 is controlled on the basis of a mobile identification number (MIN) and an electronic serial number (ESN) which are stored in the mobile station. The MIN is a digital representation of the 10-digit directory telephone number assigned to each mobile subscriber by the home system operator. The electronic serial number (ESN) is assigned by the manufacturer and permanently stored in the mobile station. The MIN/ESN pair is sent from the mobile station when originating a call and its validity is checked by the MTSO 20. If the MIN/ESN pair is determined to be invalid (e.g., if the ESN has been blacklisted because the mobile station was reported to be stolen), the system may deny access to the mobile station.

When turned on (powered up), each of the mobile stations M1–M5 enters the idle state (standby mode) and tunes to and continuously monitors the strongest control channel (generally, the control channel of the cell in which the mobile station is located at that moment). When moving between cells while in the idle state, the mobile station will eventually "lose" radio connection on the control channel of the "old" cell and tune to the control channel of the "new" cell. The initial tuning to, and the change of, control channel are both accomplished automatically by scanning all the control channels in operation in the cellular system to find the "best" control channel (in the United States, there are 21 "dedicated" control channels in each cellular system which means that the mobile station has to scan a maximum number of 21 RF channels). When a control channel with good reception quality is found, the mobile station remains tuned to this channel until the quality deteriorates again. In this manner, the mobile station remains "in touch" with the system and may receive or initiate a telephone call through one of the base stations B1–B10 which is connected to the MTSO 20.

To detect incoming calls, the mobile station continuously monitors the current control channel to determine whether a page message addressed to it (i.e., containing its MIN) has been received. A page message will be sent to the mobile station, for example, when an ordinary (landline) subscriber calls the mobile subscriber. The call is directed from the PSTN 22 to the MTSO 20 where the dialed number is analyzed. If the dialed number is validated, the MTSO 20 requests some or all of the base stations B1–B10 to page the called mobile station throughout their corresponding cells C1–C10. Each of the base stations B1–B10 which receive the request from the MTSO 20 will then transmit over the control channel of the corresponding cell a page message containing the MIN of the called mobile station. Each of the idle mobile stations M1–M5 which is present in that cell will compare the MIN in the page message received over the control channel with the MIN stored in the mobile station. The called mobile station with the matching MIN will automatically transmit a page response over the control channel to the base station, which then forwards the page response to the MTSO 20. Upon receiving the page response, the MTSO 20 selects an available voice channel in the cell from which the page response was received (the MTSO 20 maintains an idle channel list for this purpose), and requests the base station in that cell to order the mobile station via the control channel to tune to the selected voice channel. A through-connection is established once the mobile station has tuned to the selected voice channel.

When, on the other hand, a mobile subscriber initiates a call (e.g., by dialing the telephone number of an ordinary subscriber and pressing the "send" button on the telephone handset in the mobile station), the dialed number and MIN/ESN pair for the mobile station are sent over the control channel to the base station and forwarded to the MTSO 20, which validates the mobile station, assigns a voice channel and establishes a through-connection for the conversation as described before. If the mobile station moves between cells while in the conversation state, the MTSO 20 will perform a "handoff" of the call from the old base station to the new base station. The MTSO 20 selects an available voice channel in the new cell and then orders the old base station to send to the mobile station on the current voice channel in the old cell a handoff message which informs the mobile station to tune to the selected voice channel in the new cell. The handoff message is sent in a "blank and burst" mode which causes a short but hardly noticeable break in the conversation. Upon receipt of the handoff message, the mobile station tunes to the new voice channel and a through-connection is established by the MTSO 20 via the new cell. The old voice channel in the old cell is marked idle in the MTSO 20 and may be used for another conversation. Furthermore, when travelling outside the system, the mobile station may be handed off to a cell in an adjacent system if there is a roaming agreement between the operators of the two systems.

The original cellular radio systems, as described generally above, used analog transmission methods, specifically frequency modulation (FM), and duplex (two-way) RF channels in accordance with the Advanced Mobile Phone Service (AMPS) standard. According to the AMPS standard, each control or voice channel between the base station and the mobile station uses a pair of separate frequencies consisting of a forward (downlink) frequency for transmission by the base station (reception by the mobile station) and a reverse (uplink) frequency for transmission by the mobile station (reception by the base station). The AMPS system, therefore, is a single-channel-per-carrier (SCPC) system allowing for only one voice circuit (telephone conversation) per RF channel. Different users are provided access to the same set of RF channels with each user being assigned a different RF channel (pair of frequencies) in a technique known as frequency division multiple access (FDMA). This original AMPS (analog) architecture forms the basis for an industry standard sponsored by the Electronics Industries Association (EIA) and the Telecommunication Industry Association (TIA), and known as EIA/TIA-553.

In the late 1980s, however, the cellular industry in the United States began migrating from analog to digital technology, motivated in large part by the need to address the steady growth in the subscriber population and the increasing demand on system capacity. It was recognized early on that the capacity improvements sought for the next generation cellular systems could be achieved by either "cell splitting" to provide more channels per subscribers in the specific areas where increased capacity is needed, or by the use of more advanced digital radio technology in those areas, or by a combination of both approaches. According to the first approach (cell splitting), by reducing the transmit power of the base station, the size of the corresponding cell (or cell radius) and, with it, the frequency reuse distance are reduced thereby resulting in more channels per geographic area (i.e., increased capacity). Additional benefits of a smaller cell include a longer "talk time" for the user since the mobile station will use substantially lower transmit power than in a larger cell and, consequently, its battery will not need to be recharged as often.

While cell splitting held the promise of improving both capacity and coverage for the growing mobile subscriber base, the actual capacity gains were limited by the use of the analog AMPS technology. It was commonly believed that the desired capacity gains, and indeed the effectiveness of the microcellular (cell splitting) concept in increasing capacity, can be maximized only by the use of digital technology. Thus, in an effort to go digital, the EIA/TIA developed a number of air interface standards which use digital voice encoding (analog-to-digital conversion and voice compression) and time division multiple access (TDMA) or code division multiple access (CDMA) techniques to multiply the number of voice circuits (conversations) per RF channel (i.e., to increase capacity). These standards include IS-54 (TDMA) and IS-95 (CDMA), both of which are "dual mode" standards in that they support the use of the original AMPS analog voice and control channels in addition to digital speech channels defined within the existing AMPS framework (so as to ease the transition from analog to digital and to allow the continued use of existing analog mobile stations).

The dual-mode IS-54 standard, in particular, has become known as the digital AMPS (D-AMPS) standard. More recently, the EIA/TIA has developed a new specification for D-AMPS, which includes a digital control channel suitable for supporting public or private microcell operation, extended mobile station battery life, and enhanced end-user features. This new specification builds on the IS-54B standard (the current revision of IS-54), and it is known as IS-136. (All of the foregoing EIA/TIA standards are hereby incorporated herein by reference as may be necessary for a full understanding of these background developments. Copies of these standards may be obtained from the Electronics Industries Association, 2001 Pennsylvania Avenue, N.W., Washington, D.C. 20006).

According to IS-54B and as shown in FIG. 2, each RF channel is time division multiplexed (TDM) into a series of repeating time slots which are grouped into frames carrying from three to six digital speech channels (three to six telephone conversations) depending on the source rate of the speech coder used for each digital speech channel. Each frame on the RF channel comprises six equally sized time slots (1–6) and is 40 ms long (i.e, there are 25 frames per second). The speech coder for each digital traffic channel (DTCH) can operate at either full-rate or half-rate. A full-rate DTCH uses two equally spaced slots of the frame (i.e., slots 1 and 4, or slots 2 and 5, or slots 3 and 6). When operating at full-rate, the RF channel may be assigned to three users (A–C). Thus, for example, user A is assigned to slots 1 and 4, user B is assigned to slots 2 and 5, and user C is assigned to slots 3 and 6 of the frame as shown in FIG. 2. Each half-rate DTCH uses only one time slot of the frame. At half-rate, the RF channel may be assigned to six users (A–F) with each user being assigned to one of the six slots of the frame as also shown in FIG. 2. Thus, it can be seen that the DTCH as specified in the IS-54B standard allows for an increase in capacity of from three to six times that of the analog RF channel. At call set-up or handoff, a dual-mode mobile station will be assigned preferably to a digital traffic channel (DTCH) and, if none is available, it can be assigned to an analog voice channel (AVC). An analog-only mobile station, however, can only be assigned to an AVC.

The IS-136 standard specifies a digital control channel (DCCH) which is defined similarly to the digital traffic channel (DTCH) specified in IS-54B (i.e., on the same set of RF channels and with the same TDMA frame format and slot size). Referring back to FIG. 2, a half-rate DCCH would occupy one slot while a full-rate DCCH would occupy two slots out of the six slots in each 40 ms frame. The DCCH slots may then be mapped into different logical channels which are organized into a series of superframes. FIG. 3 shows the superframe structure of a full-rate DCCH according to IS-136 (in this example, the DCCH is defined over channel "A" in the TDMA frame). A superframe is defined in IS-136 as the collection of 32 consecutive time slots (640 ms) for a full-rate DCCH (16 slots for a half-rate DCCH). The logical channels specified in IS-136 include a fast, an extended and a point-to-multipoint short message service broadcast control channels (F-BCCH, E-BCCH and S-BCCH, respectively) for carrying system-related information which is broadcast to all mobile stations, and a short message service, paging and access response channel (SPACH) for carrying information which is sent to specific mobile stations (e.g., paging or text messages).

The standards generally described above (IS-54B and IS-136) are not the only digital standards which have been developed or deployed over the past few years. Other digital standards such as Group Special Mobile (GSM) and Personal Digital Cellular (PDC), which also use TDMA, have been widely adopted in certain parts of the world (e.g., Europe and Japan in the case of GSM and PDC, respectively). Among other differences, the existing standards may use different frequency bands for communications between the base station and the mobile station. For example, IS-54B uses a "single" band which actually consists of a pair of frequency bands, one band for transmission and another band for reception by the mobile station. The transmit band (mobile station to base station) extends from 824 MHz to 849 MHz while the receive band (base station to mobile station) extends from 869 MHz to 894 MHz. Each of the RF channels consists of a transmit center frequency (forward channel) in the range 824–849 MHz and a corresponding receive center frequency (reverse channel) in the range 869–894 MHz. The spacing between the center frequencies of adjacent transmit or receive channels is 30 KHz. Furthermore, the transmit and receive center frequencies for any RF channel are separated by 45 MHz (i.e., each transmit channel is paired with a receive channel that is 45 MHz higher in frequency).

PDC, on the other hand, uses a "dual" band, that is, two bands, each of which (like IS-54B) actually consists of a pair of frequency bands. The first band consists of a receive band (base station to mobile station) extending from 810 MHz to 828 MHz, and a corresponding transmit band (mobile station to base station) extending from 940 MHz to 958 MHz. Each of the RF channels in the first band consists of a receive center frequency in the range 810–828 MHz, and a corresponding transmit center frequency in the range 940–958 MHz, with the two center frequencies being separated by 130 MHz (i.e., each receive channel is paired with a transmit channel that is 130 MHz higher in frequency). The second band consists of a receive band (base station to mobile station) extending from 870 MHz to 885 MHz, and a corresponding transmit band (mobile station to base station) extending from 925 MHz to 940 MHz. Each of the RF channels in the second band consists of a receive center frequency in the range 870–885 MHz, and a corresponding transmit center frequency in the range 925–940 MHz, with the two center frequencies being separated by 55 MHz (i.e., each receive channel is paired with a transmit channel that is 55 MHz higher in frequency). The spacing between the center frequencies of adjacent channels is 25 KHz in both the first and second PDC bands.

A mobile station operating according to the PDC standard must be able to transmit and receive (i.e., "transceive") in both the first and the second bands. FIG. 4 shows a typical design for a transceiver which can operate in the first PDC band (this design also may be used for operation in a single band as specified in AMPS or D-AMPS). An incoming (received) signal in the 810–828 MHz range is passed through a band pass filter (BPF) 30 which attenuates out-of-band signals and noise. The output of the BPF 30 then is mixed with the output of a main channel synthesizer (first local oscillator) 32 in a mixer 34 to produce a pair of sum and difference frequencies, as well known in the art. These signal products are passed through a BPF 36 which filters out the (higher) sum frequency leaving only the difference (lower) frequency. The effect of this first mixing and filtering stage is to downconvert the received signal into a first intermediate frequency (IF) signal, which is presented at the output of the BPF 36. This first IF signal is further downconverted into a second IF signal by mixing it with the output of an auxiliary synthesizer (second local oscillator) 38 in a mixer 40, and then filtering the output of the mixer 40 in a BPF 42 so as to select the lower frequency from the mixer 40.

As also shown in FIG. 4, the main channel synthesizer 32 can be used in conjunction with a transmit offset synthesizer 44 to upconvert a baseband signal into a signal in the desired 940–958 MHz range. The baseband signal, which may be comprised of in-phase (I) and out-of-phase (Q) components, is fed to an IQ modulator 46 which modulates the baseband signal onto a carrier signal provided by the transmit offset synthesizer 44. The output of the IQ modulator 46 is mixed in a mixer 48 with the output of the main channel synthesizer 32, and the output of the mixer 48 is passed through a BPF 50 so as to select the desired frequency from the mixer 48.

The circuit of FIG. 4 can be configured to receive or transmit in any RF channel within the first PDC band by appropriate setting of the main channel synthesizer 32, the auxiliary synthesizer 38 and the transmit offset synthesizer 44. For example, if the desired transmit and receive frequencies are 940 and 810 MHz, respectively, the main channel synthesizer 32 can be set to operate at 1008.85 MHz. The mixer 34 will generate a sum frequency signal at 1818.85 and a difference frequency signal at 198.85 MHz.

The higher frequency is filtered out in the BPF 36 and the lower frequency is mixed with the output of the auxiliary synthesizer 38, which is set to operate at 198.4 MHz. The mixer 40 will generate a sum frequency signal at 397.25 MHz and a difference frequency signal at 0.45 MHz (450 KHz). The higher frequency is filtered out in the BPF 42 and the lower frequency is delivered for further RF processing (not shown). In the transmit direction, the transmit offset synthesizer 44 may be set to operate at 68.85 MHz. This carrier frequency is modulated in the IQ modulator 46 and mixed with the 1008.85 MHz signal from the main channel synthesizer 32. The mixer 48 will generate a sum frequency signal at 1077.7 MHz and a difference frequency signal at 940 MHz. The higher frequency is filtered out in the BPF 50 leaving the desired transmit frequency at 940 MHz for delivery to an antenna (not shown).

Extending the circuit of FIG. 4 to operation in the second PDC band presents difficulties because of the different transmit-receive (TX-RX) channel separations (130 MHz in the first PDC band and 55 MHz in the second PDC band). These difficulties are best understood in terms of the following relationships:

$$f_s = f_t - f_r = (f_m - f_o) - (f_m - f_i) = f_i - f_o$$

where $f_s$ is the TX-RX channel separation (or split), $f_t$ is the TX frequency, $f_r$ is the RX frequency, $f_m$ is the frequency of the main channel synthesizer 32, $f_o$ is the frequency of the TX offset synthesizer 44 and $f_i$ is the first intermediate frequency (IF) at the output of the BPF 36. It will be readily appreciated from the above equation that if the TX-RX channel separation is changed to accommodate the second PDC band, either the first IF or the frequency of the TX offset synthesizer 44 must change in the circuit of FIG. 4. Economic considerations generally dictate that the first IF be a single, fixed frequency. Hence, in the prior art, the circuit of FIG. 4 was modified by adding a second transmit offset synthesizer 52 and a switch 54 to switch between the first and second offset synthesizers 44 and 52, respectively, when switching operation between the first and second PDC bands, respectively, as shown in FIG. 5. Alternatively, the prior art sought to avoid the duplication of components by replacing the two offset synthesizers in FIG. 5 with one frequency agile synthesizer which can "hop" between two different frequencies for operation in the first and second PDC bands, respectively. Both of these prior art approaches, however, increase the cost and complexity of the circuit.

In light of the shortcomings of the prior art, there is a need for a frequency synthesis circuit which is suitable for operation in two different frequency bands having different TX-RX channel separations (such as but not limited to the first and second PDC bands described above), but which has lower cost and reduced complexity as compared with prior art circuits. Such a circuit is provided by the present invention. As will be seen, the approach of the present invention also can be used to reduce circuit cost and complexity in mobile stations which operate in a single frequency band.

SUMMARY OF THE INVENTION

The present invention provides an economic solution to the problem of operating a mobile station on two different frequency bands characterized by different transmit-receive (TX-RX) channel separations, which heretofore often required the use of two transmit offset synthesizers. In accordance with the present invention, one or both of these offset synthesizers can be eliminated by deriving an appropriate transmit offset signal from the existing auxiliary synthesizer through a relatively simple frequency scaling circuit (e.g., frequency divider or multiplier). This solution, however, may require that the main channel synthesizer "hop" between two different frequencies when the mobile station switches between transmitting and receiving. Thus, the present invention further provides a fast settling main channel synthesizer which is able to accomplish such frequency hopping in less than the time specified for switching between transmit and receive states in a TDMA frame as specified in standards such as PDC, for example, without incurring any additional phase noise as compared with conventional implementations.

It will be appreciated that the technique of deriving a transmit offset signal from the auxiliary synthesizer, as taught by the present invention, also can be applied to mobile stations which operate in only one frequency band. In this case, eliminating the transmit offset synthesizer results in a more economic design requiring the use of no more than two frequency synthesizers (i.e., the main channel synthesizer and the auxiliary synthesizer).

In one aspect, the present invention provides a mobile station comprising means for receiving a radio frequency (RF) signal; means for processing an analog signal into a data signal; a main channel synthesizer for generating a first local oscillator (LO) signal; an auxiliary synthesizer for generating a second LO signal; a first mixing means for combining the first LO signal with the received RF signal to produce a first intermediate frequency (IF) signal; a second mixing means for combining the first IF signal with the second LO signal to produce a second IF signal; frequency scaling means for scaling the frequency of the second LO signal to produce a transmit offset signal; modulation means for modulating the transmit offset signal with the data signal; and a third mixing means for combining the first LO signal with the data modulated signal to produce a transmit RF signal. According to this aspect, the scaling means may comprise a frequency divider or a frequency multiplier, as appropriate.

The fast settling main channel synthesizer of the present invention may comprise a voltage controlled oscillator (VCO) for generating the first LO signal; a fourth mixing means for combining the first LO signal with a predetermined frequency signal to lower the frequency of the first LO signal; a programmable frequency divider for dividing the frequency of the lower frequency first LO signal; a phase detector for comparing the output of the frequency divider to a reference frequency signal and for generating a tuning signal to the VCO based on the comparison; and a loop filter at the input of the VCO for filtering the tuning signal. This construction of the main channel synthesizer allows for an increase in the bandwidth of the loop filter and, therefore, a decrease in the settling time of the main channel synthesizer without an increase in overall phase noise. Alternatively, this construction of the main channel synthesizer may be used to decrease overall phase noise without increasing the settling time of the main channel synthesizer. The predetermined frequency signal, which is mixed with the feedback signal from the VCO, may be derived from the second LO signal or from any low noise source available in the mobile station.

In another aspect, the present invention provides a method for transceiving radio frequency (RF) signals in a mobile station comprising the steps of generating a first local oscillator (LO) signal; generating a second LO signal; mixing the first LO signal with a received RF signal to produce a first intermediate frequency (IF) signal; mixing the first IF signal with the second LO signal to produce a second IF signal; scaling the frequency of the second LO signal to produce a transmit offset signal; modulating the transmit offset signal with a data signal; and mixing the first LO signal with the data modulated signal to produce a transmit RF signal. This method may be used to receive and transmit signals in the first or second RF bands defined in PDC, for example, without the need for using two transmit offset synthesizers.

According to this method, the first LO signal may be generated in a voltage controlled oscillator (VCO) which is tuned in a phase lock loop (PLL) comprising a mixer, a frequency divider, a phase detector and a loop filter. The bandwidth of the loop filter is expansively selected as to minimize the settling time of the VCO. The output of the VCO is fed back to the mixer and mixed with a predetermined low noise frequency signal to lower the frequency of the feedback signal at the input to the frequency divider which, in turn, lowers the amount of phase noise at the output of the frequency divider, thus offsetting any increase in phase noise in the PLL due to any expansion of the bandwidth of the loop filter. The output of the frequency divider is compared with a reference frequency signal which is input to the phase detector, and the output of the phase detector is filtered in the loop filter and provided as a tuning signal to the VCO.

These and other aspects, objects and advantages of the present invention will become readily apparent from the accompanying drawings and the detailed description as set forth below.

BRIEF DESCRIPTION OF THE DRAWINGS

The present invention will be better understood and its numerous objects and advantages will become apparent to those skilled in the art by reference to the following drawings in which.

DETAILED DESCRIPTION

Figure 6:
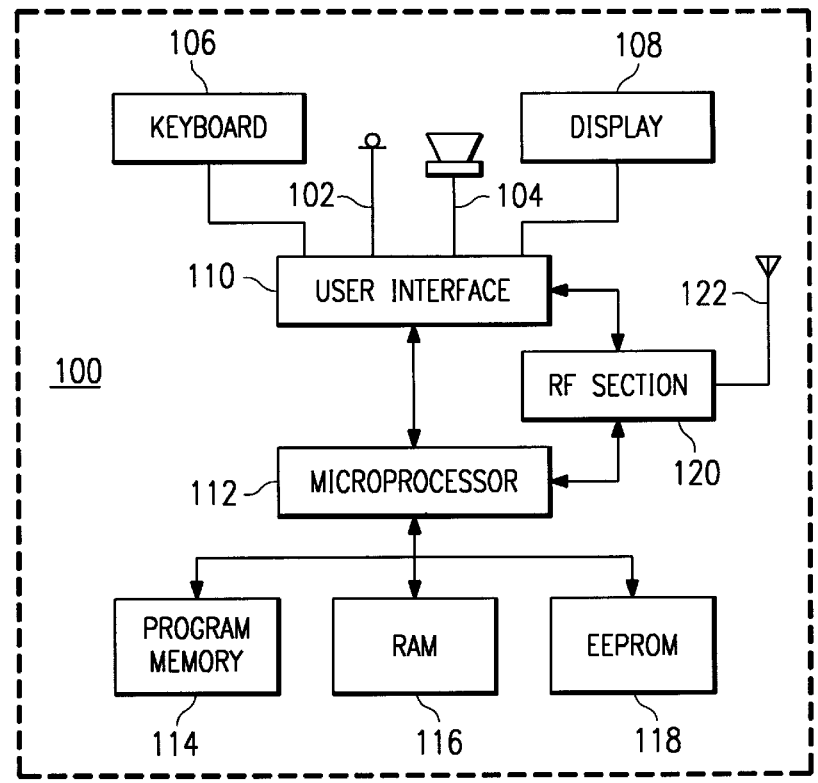
FIG. 6 is a simplified block diagram of a mobile station which may be used in accordance with the present invention.

Referring now to FIG. 6, there is shown a simplified block diagram of an exemplary mobile station 100 which may be used in accordance with the present invention. The mobile station 100 comprises a microphone 102, a loudspeaker 104, a keyboard or keypad 106, an alphanumeric or graphical display 108, a user interface 110, a microprocessor 112, a program memory 114, a random access memory (RAM) 116, an electrically erasable programmable read only memory (EEPROM) 118, a radio frequency (RF) section 120 and an antenna 122.

The user interface 110 includes speech and data processing circuitry (not specifically shown) such as a codec for performing analog-to-digital (A/D) conversion of a transmit speech signal from the microphone 102 and digital-to-analog (D/A) conversion of a received speech signal destined for the loudspeaker 104. The user interface 110 further includes a digital signal processor (DSP) for performing gain/attenuation, filtering, compression/decompression, channel coding/decoding and any other desired processing (e.g., in accordance with the PDC standard) of speech and user or control data. In the preferred embodiment, the user interface 110 supplies in-phase (I) and out-of-phase (Q) modulation waveforms to the RF section 120.

The microprocessor 112 controls the overall operation of the mobile station 100 through software programs stored in the program memory 114. These programs may include, for example, executable instructions for each of the transmit and receive operations on the digital control channel (DCCH) and the digital traffic channel (DTCH) as specified, for example, in the PDC standard. The RAM 116 holds the values of temporary variables used in the execution of these instructions. Parameters whose values must be preserved after power is turned off in the mobile station 100 may be stored in the EEPROM 118 (or in a similar non-volatile or flash memory). Such parameters may include, for example, the mobile identification number (MIN), the electronic serial number (ESN) of the mobile station 100, and the system identification of the home system (SIDH) of the mobile station 100.

Generally speaking, the RF section 120 includes RF processing circuitry (not specifically shown in FIG. 6) such as an RF transmitter for modulating the I and Q data onto an analog carrier signal, upconverting the modulated signal to the selected channel frequency and then filtering, amplifying and transmitting the signal through the antenna 122. The RF section 120 further includes an RF receiver for downconverting a modulated signal received through the antenna 122 into at least one intermediate frequency (IF) signal that may be then filtered and demodulated before being processed in the DSP.

Figure 4:
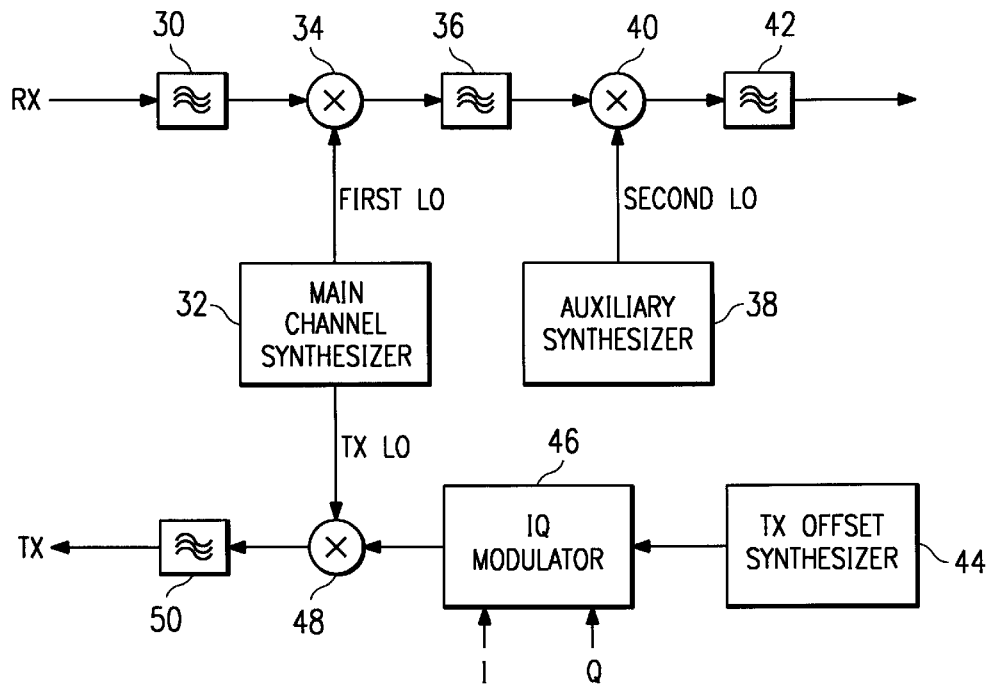
FIG. 4 is a block diagram of a conventional transceiver for operating in a first frequency band as specified in PDC, AMPS, or D-AMPS, all known industry standards.
Figure 5:
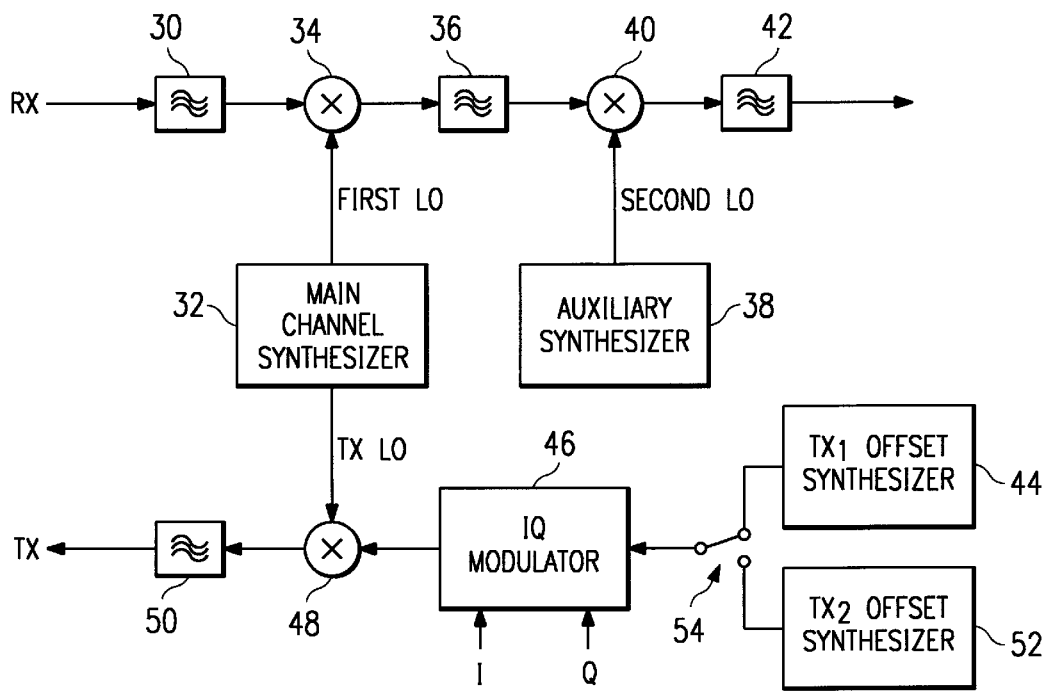
FIG. 5 is a block diagram of a conventional transceiver for operating in a first or a second frequency band as specified in PDC.
Figure 7:
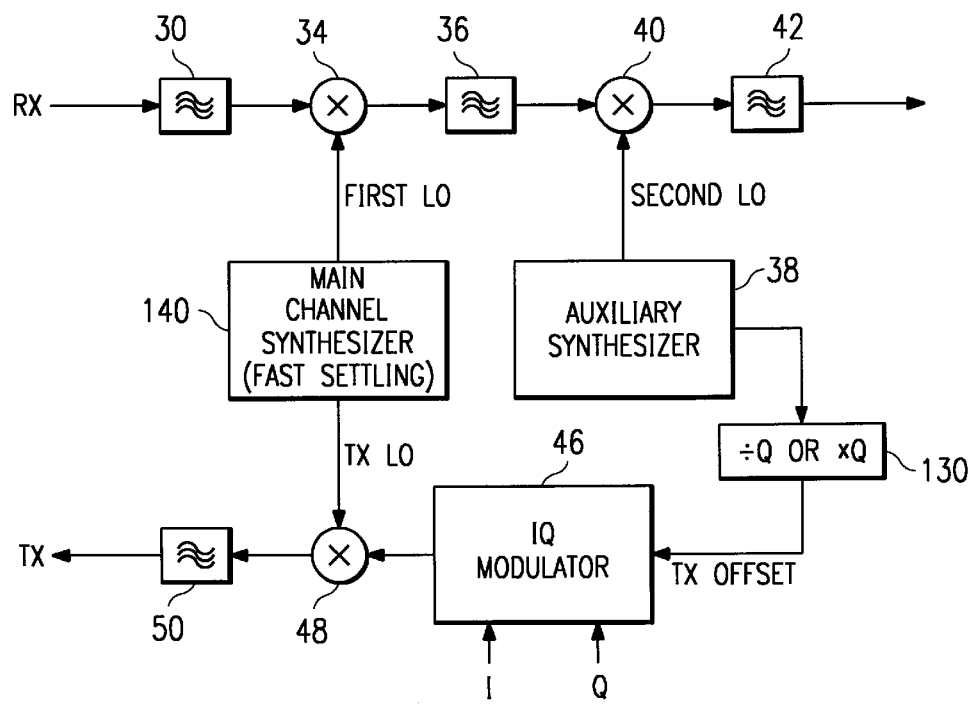
FIG. 7 is a block diagram of a transceiver constructed in accordance with the present invention for operating in the first or second PDC band.

FIG. 7 shows a more detailed depiction of the RF section 120 as provided by the present invention. Instead of generating the transmit offset signal from one or more offset synthesizers as taught by the prior art and shown in FIGS. 4–5, the present invention derives this signal from the auxiliary synthesizer 38 by means of a simple and inexpensive divide-by-Q (÷Q) or multiply-by-Q (×Q) scaling circuit 130, thus eliminating the need to use the more expensive and complex transmit offset synthesizers 44 and/or 52 (FIGS. 4–5). The value of Q can be selected as appropriate for operation in the desired frequency band, as illustrated below.

Figure 1:
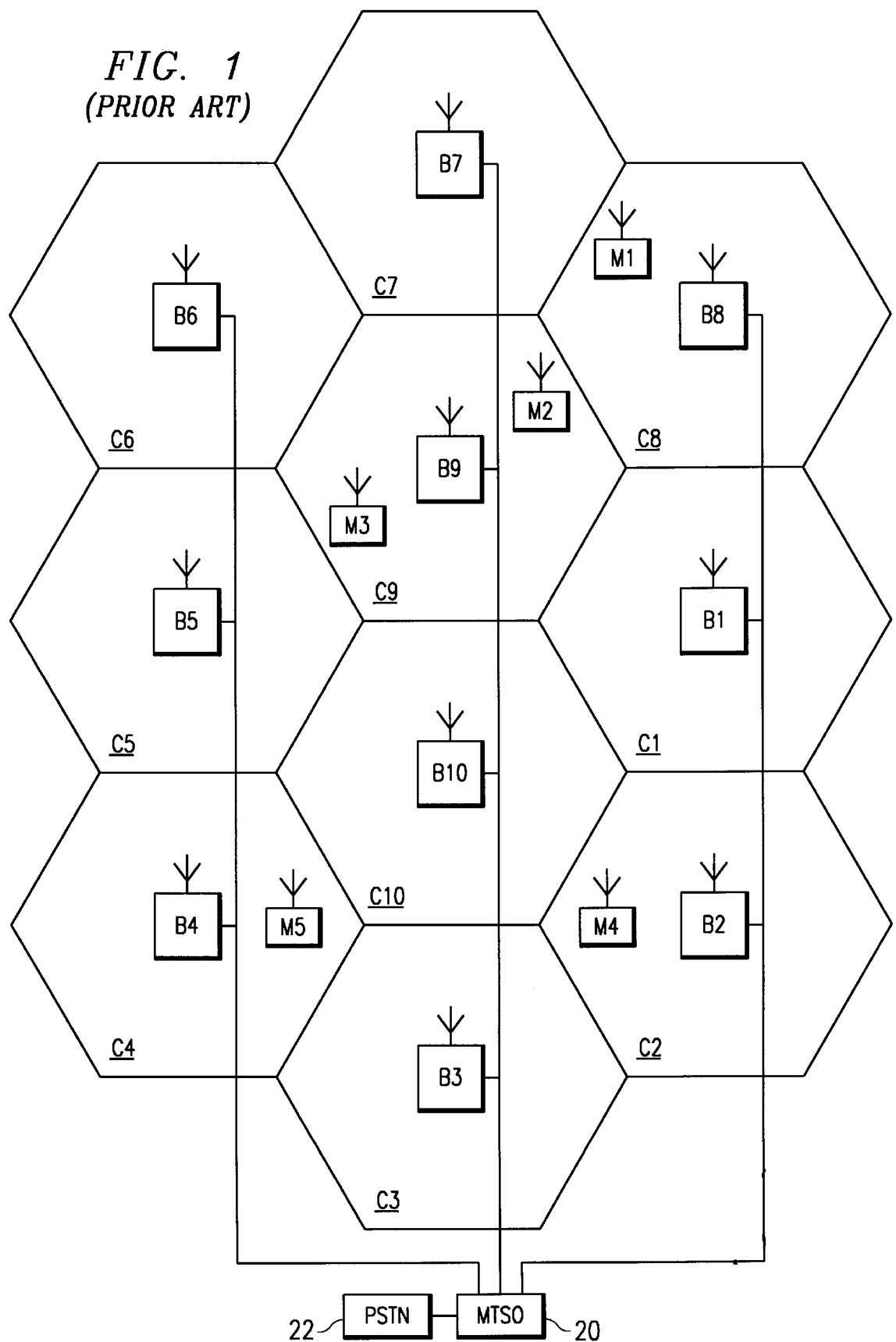
FIG. 1 shows the architecture of a conventional cellular radio system including a plurality of mobile stations and base stations communicating over a plurality of radio frequency (RF) channels.
Figure 2:
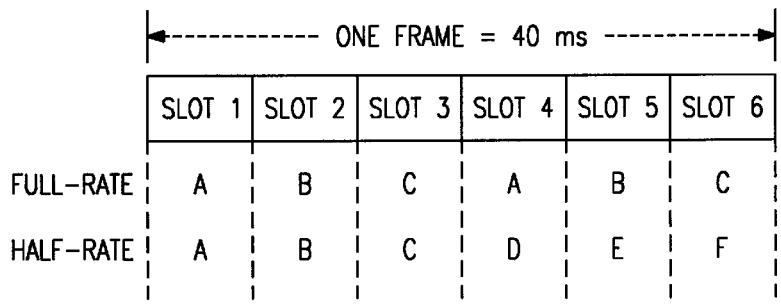
FIG. 2 shows the structure of a time division multiplexed (TDM) RF channel according to IS-54B, a known industry standard.
Figure 3:
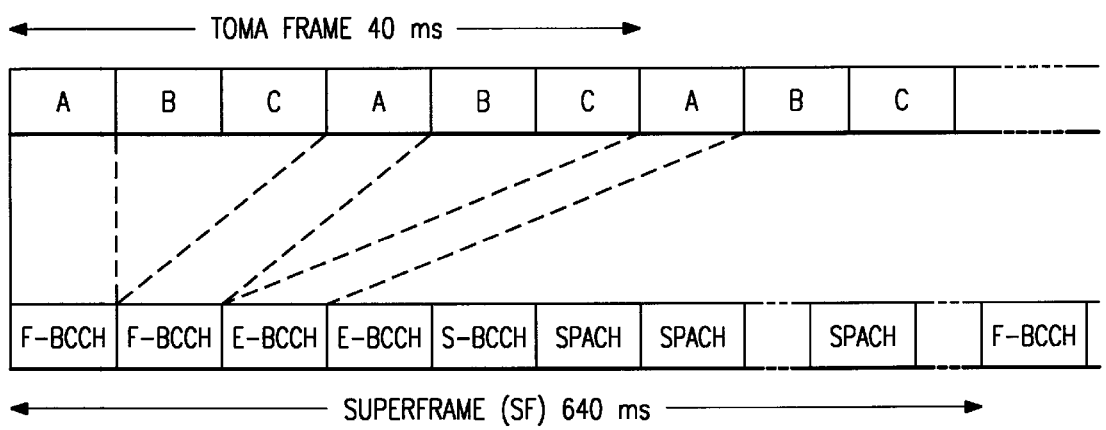
FIG. 3 shows the structure for a superframe of a digital control channel (DCCH) defined over the TDM RF channel shown in FIG. 2 as specified in IS-136, a known industry standard.

For operation in the first PDC band at a transmit frequency of 940 MHz and a receive frequency of 810 MHz, for example, a divide-by-2 (÷2) scaling circuit 130 may be used with the main channel synthesizer 32 set at a frequency of 1008.85 MHz and the auxiliary synthesizer 38 set at a frequency of 198.4 MHz (as in the prior example described in connection with FIGS. 4–5). In this case, the first and second (receive) IF signals, respectively, will be 198.85 MHz and 450 KHz (as before), and the transmit offset signal will be 99.2 MHz. To produce the desired transmit signal at 940 MHz, the frequency of the main channel synthesizer 32 should hop from 1008.85 MHz when the mobile station 100 is receiving to 1039.2 MHz when the mobile station 100 is transmitting. This frequency hopping is possible, even though the same main channel synthesizer 32 is used for upconverting the transmit signal and downconverting the received signal, because the mobile station 100 transmits and receives at different times within a TDMA frame as shown, for example, in FIG. 2.

It will be noted, however, that this frequency hopping must be accomplished in no more time than specified for the mobile station to switch between the transmit and receive states in each TDMA frame. In many standards, such as PDC, the TDMA frame may be viewed (from the perspective of the mobile station 100) as a series of slots which repeat in the following order: an idle slot, a received slot, an idle slot and a transmit slot. Thus, only one time slot may separate the transmit and receive operations. Depending on the length of the TDMA frame, the main channel synthesizer 32 may have to be sufficiently agile so as to transition from one state and settle in another state in as little as one millisecond (ms). As described further below, the present invention also provides a fast settling (agile) main channel synthesizer 140 which facilitates such frequency hopping.

Figure 8:
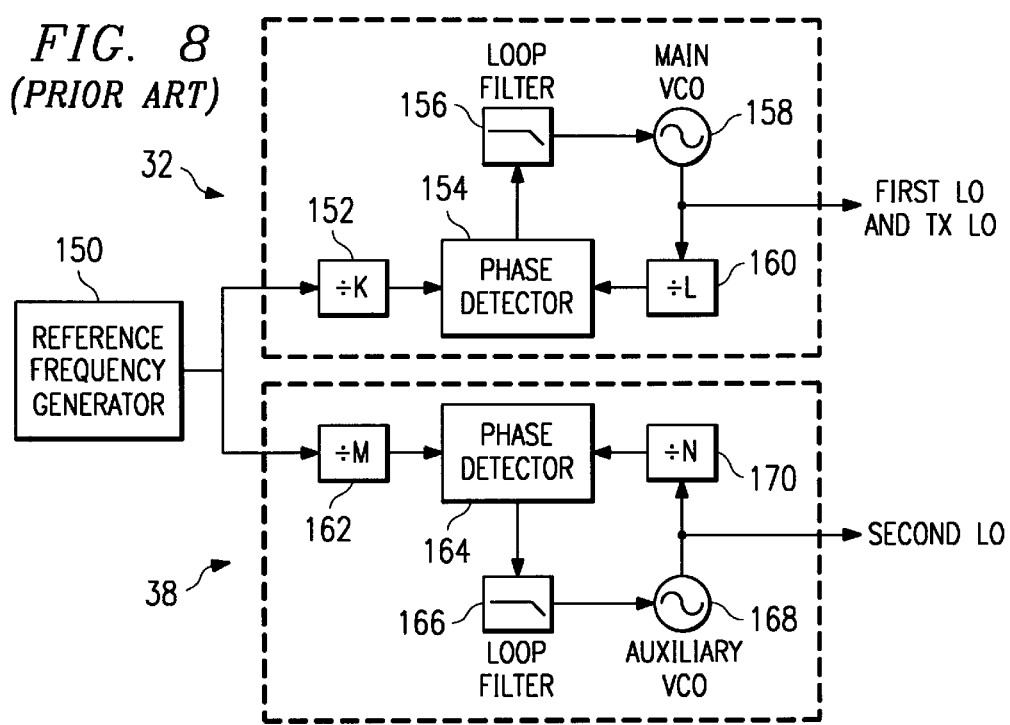
FIG. 8 is a block diagram of the main channel synthesizer and auxiliary synthesizer shown in FIGS. 4–5.

The improvements introduced in the main channel synthesizer 140 of the present invention are best understood by reference to the limitations of the main channel synthesizer 32 of the prior art. FIG. 8 shows a conventional construction of a combination of the main channel synthesizer 32 and the auxiliary synthesizer 38, in which each of the synthesizers derives a separate reference frequency signal from a common reference frequency generator 150 operating, for example, at 14.4 MHz. A programmable frequency divider (divide-by-K operator) 152 in the main channel synthesizer 32 reduces the frequency of the 14.4 MHz reference signal by a factor of "K" so that it can be applied to a phase-lock-loop (PLL) which includes a phase detector (comparator) 154, a loop filter 156, a main voltage controlled oscillator (VCO) 158 and a programmable frequency divider (divide-by-L operator) 160. Similarly, a programmable frequency divider (divide-by-M operator) in the auxiliary synthesizer 38 reduces the frequency of the 14.4 MHz reference signal by a factor of "M" so that it can be applied to a PLL which includes a phase detector 164, a loop filter 166, an auxiliary VCO 168 and a programmable frequency divider (divide-by-N operator) 170.

The main VCO 158 in the main channel synthesizer 32 may be used to generate stable carrier frequencies generally within the range 1009–1084 MHz, in increments of 25 KHz, which is the channel spacing in PDC, while the auxiliary VCO 168 in the auxiliary synthesizer 38 may be used to generate a fixed frequency at 198.4 MHz. Each of the main VCO 158 and the auxiliary VCO 168 may be tuned to the desired frequency by the application of an appropriate voltage at its input (as well known in the art, a VCO adjusts its output frequency in proportion to the input voltage). For this purpose, the microprocessor 112 (FIG. 6) controls the selection of the appropriate values for the divide ratios "L" and "N" in the frequency dividers 160 and 170, respectively. The phase detector 154 compares the phase of the frequency divided VCO signal at the output of the divider 160 to the phase of the reference signal at the output of the divider 152, and generates an error voltage signal in proportion to the phase difference. This error voltage signal is fed back through the loop filter 156 and used to fine tune the frequency of the main VCO 158 until it matches the frequency of the output of the divider 152 when multiplied by a factor of L. In a similar manner, the auxiliary VCO 168 may be tuned and locked to its desired frequency.

The particular values of the frequency divide ratios K and L or M and N in the circuit of FIG. 8 should be selected with a view to minimizing the phase noise at the output of the main channel synthesizer 32 or the auxiliary synthesizer 38, respectively, while meeting the requirements of the applicable frequency plan. As well known in the art, the phase noise at the output of a divide-by-K operator, for example, is 20 LogK decibels higher relative to the phase noise at its input. Assuming that the reference frequency signal from the generator 150 is relatively steady and noise free, which is the usual case, the output signals from the frequency dividers 152 and 162 should not introduce significant phase noise into the PLL in the main channel synthesizer 32 and the auxiliary synthesizer 38, respectively. Furthermore, the frequency of the auxiliary VCO 168 is fixed (at 198.4 MHz) and, therefore, the feedback signal at the input to the frequency divider 170 should be relatively noise free since the frequency of the reference signal into the phase detector 164 may be selected to be relatively high (e.g., 1.6 MHz, where M=9 and N=124). The low divide ratio (N=124) means that the phase noise from the phase detector 164 is multiplied by a relatively low value (20 Log N), thus resulting in low phase noise at the output of the auxiliary synthesizer 38.

The frequency of the main VCO 158, however, must be stepped for operation on different channels, thus requiring the use of a low frequency reference signal at the input to the phase detector 154 and a high divide ratio (L) in the frequency divider 160. On the other hand, the divide ratio L must be minimized to improve phase noise at the output of the main synthesizer 32. For PDC operation with 25 KHz channel spacing, the main VCO 158 must be able to step in 25 KHz increments and, therefore, the frequency of the signal at the input to the phase detector 154 should be 25 KHz, or some small multiple of 25 KHz if a fractional divide synthesizer is employed. If the value of K is selected to be 72, for example, the input to the phase detector 154 will be a 200 KHz signal (equal to 8×25 KHz). In this case, the desired 25 KHz resolution can be achieved using a 200 KHz reference signal if a Modulo 8 fractional divide synthesizer is employed. The divide ratio L will vary depending on the frequency of the main VCO 158 so as to converge the output of the frequency divider 160 to the 200 KHz reference frequency. The maximum value of L in this example will be 5420 (which is reached when the frequency of the main VCO 158 is at 1084 MHz).

As will be appreciated by persons of ordinary skill in the art, to achieve a fast frequency lock when the main channel synthesizer 32 is hopping between frequencies in accordance with the present invention, the settling time for the main channel synthesizer 32 (i.e., the time required for the main VCO 158 to settle to the desired frequency after the divider 160 has been programmed with the proper value of L) can be reduced by increasing the bandwidth of the loop filter 156. However, increasing the loop bandwidth would lead to an increase in the phase noise appearing at the output of the main VCO 158 since higher frequency phase noise will then pass through the loop filter 156. Such phase noise may adversely affect the operation of the mobile station 100 in several respects. First, the signal output by the transmitter may not meet the spectral mask requirements imposed by regulatory agencies (e.g., FCC). Second, the receiver may not have sufficient adjacent and/or alternate channel suppression due to the appearance of a faux local oscillator signal corresponding to spectral energy which is attributable to the presence of phase noise. Third, the receiver may suffer from a higher number of decoding errors caused by movement in the points of the modulation constellation in response to the magnitude of the error vector introduced by the phase noise, as described, for example, in Law et al., "Identifying RF-Related Impairments in Full-Service Digital Networks," *Microwave Journal*, pp. 88–94 (March 1996).

Figure 9:
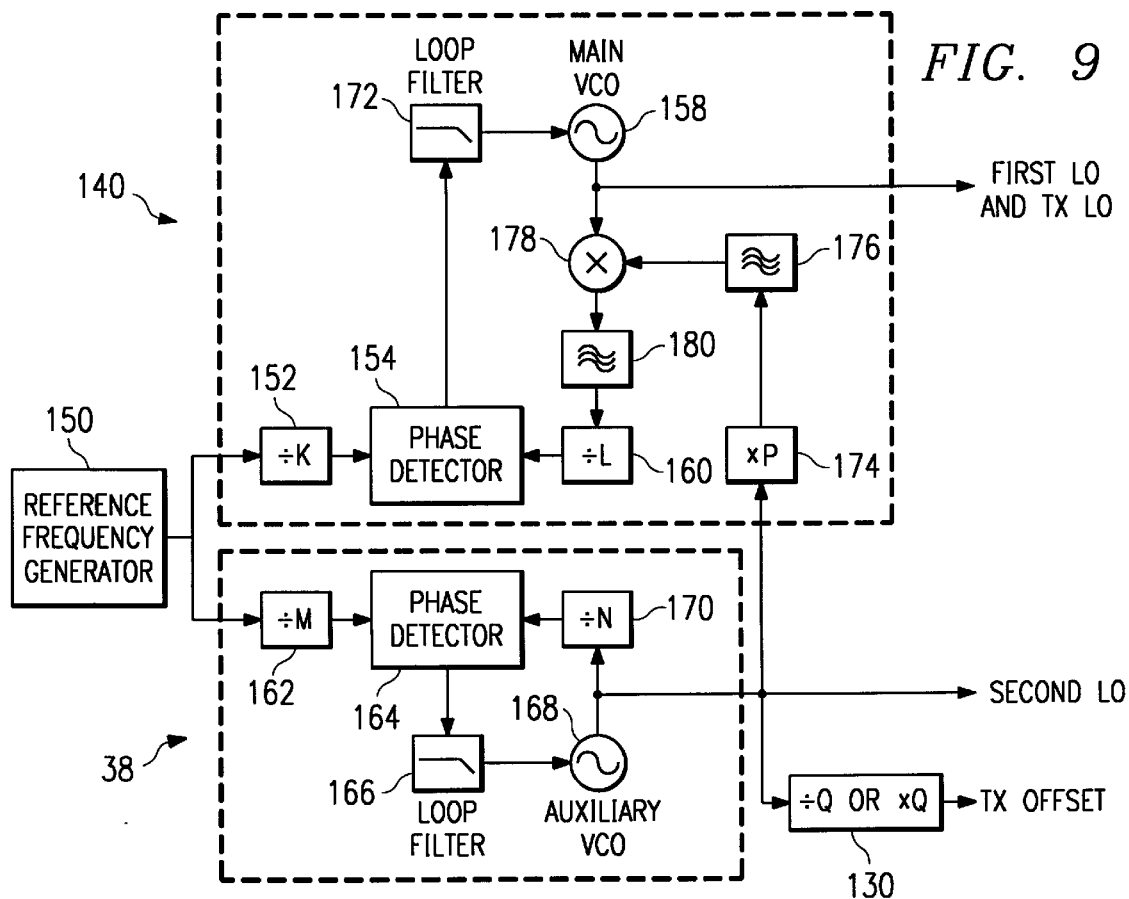
FIG. 9 is a block diagram of the fast settling main channel synthesizer and auxiliary synthesizer shown in FIG. 7.

To minimize the settling time while also minimizing the phase noise in the main channel synthesizer 32, the present invention provides a fast settling main channel synthesizer 140 in which the settling time is reduced by using a loop filter 172 which has a wider bandwidth than the loop filter 156, and in which the phase noise is reduced by reducing the divide ratio L, as shown in FIG. 9. The value of L is reduced in FIG. 9 by reducing the frequency of the signal output from the main VCO 158 before feeding it to the divide-by-L operator 160. To accomplish this frequency reduction inexpensively and without the addition of undesired noise, the output of the main VCO 158 can be mixed with any spectrally pure harmonic or relatively noise free signal which may be available in the mobile station 100 for this purpose. For example, as shown in FIG. 9, the output of the auxiliary VCO 168 may be scaled as necessary in a frequency multiplier 174, filtered in a BPF 176 to remove undesired harmonics (i.e., other than the harmonic at 4×frequency of the auxiliary VCO 168 in this example), and then provided to a mixer 178 for mixing with the output of the main VCO 158. The higher sum frequency from the mixer 178 can then be filtered out in a BPF 180 and the lower difference frequency passed to the divide-by-L operator 160.

It will be appreciated that, as distinguished from a frequency divider, the mixer 178 has an additive rather than a logarithmic effect on any noise appearing at its inputs. Thus, so long as a relatively noise free source, such as the auxiliary VCO 168, is used for the signal to be mixed with the output of the main VCO 158, the effect of the mixer 178 on the magnitude of noise in the fast settling main channel synthesizer 140 will be minimal. It will be further appreciated that the signal used for mixing down the output of the main VCO 158 may be derived from any available sources with acceptable phase noise characteristics, other than the auxiliary VCO 168. For example, in an alternative embodiment of the fast settling main channel synthesizer 140, this signal is derived from the reference frequency generator 150 and scaled as appropriate by means of a frequency multiplication circuit.

Figure 10:
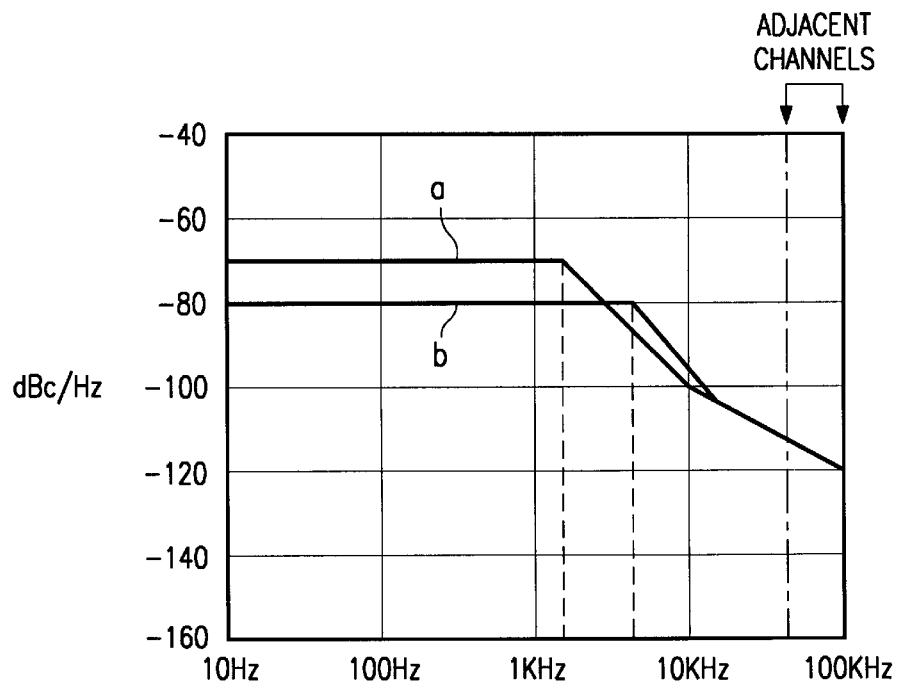
FIG. 10 is a graph comparing the phase noise performance of the conventional main channel synthesizer as shown in FIG. 8 and the fast settling main channel synthesizer of the present invention as shown in FIG. 9.

FIG. 10 illustrates, in graphical form, that the operation of the fast settling main channel synthesizer 140 of the present invention allows for an increase in the loop bandwidth, and therefore achieves faster settling time, while providing for phase noise performance equivalent to or better than the conventional main channel synthesizer 32. The horizontal axis in FIG. 10 represents the offset of the phase noise from the carrier frequency (the offset being expressed in Hz according to a logarithmic scale), while the vertical axis represents the spectral energy in decibels of the phase noise relative to the carrier frequency (dBc). The curve designated with the letter "a" represents the performance of the conventional main channel synthesizer 32 while the curve designated with the letter "b" represents the performance of the fast settling main channel synthesizer 140 of the present invention. These curves are drawn to numerical values which are based on operation in the PDC band in accordance with the examples shown in previous figures.

With continuing reference to FIG. 10, the horizontal line portions of the curves "a" and "b" represent the bandwidths of the loop filter 156 in the conventional main channel synthesizer 32 and the loop filter 172 in the inventive fast settling main channel synthesizer 140, respectively. It will be seen (as shown by the leftmost pair of dashed vertical lines) that the fast settling main channel synthesizer 140 has a wider loop bandwidth and, therefore, will settle faster than the conventional main channel synthesizer 32. Nevertheless, the overall integrated phase noise exhibited by the fast settling main channel synthesizer 140 is lower than the overall integrated phase noise exhibited by the conventional main channel synthesizer 32. Thus, the present invention is able to decrease settling time without increasing overall phase noise as compared with conventional implementations.

Furthermore, it will be seen from FIG. 10 that the fast settling main channel synthesizer 140 and the conventional main channel synthesizer 32 exhibit identical rejection of noise energy from adjacent channels since the curves "a" and "b" converge at 25 KHz and are identical at greater offsets from the carrier where the phase noise at the output of the main channel synthesizer 140 is comprised almost entirely of phase noise generated by the VCO 158 (as distinguished from phase noise generated by the phase detector 154 and/or the reference frequency generator 150, which is filtered out by the loop filter 172). In sum, the design of the fast settling main channel synthesizer 140 of the present invention decreases the phase lock time, while minimizing phase noise (maintaining signal quality) in the main RF channel and minimizing interference with adjacent channels.

Figure 11:
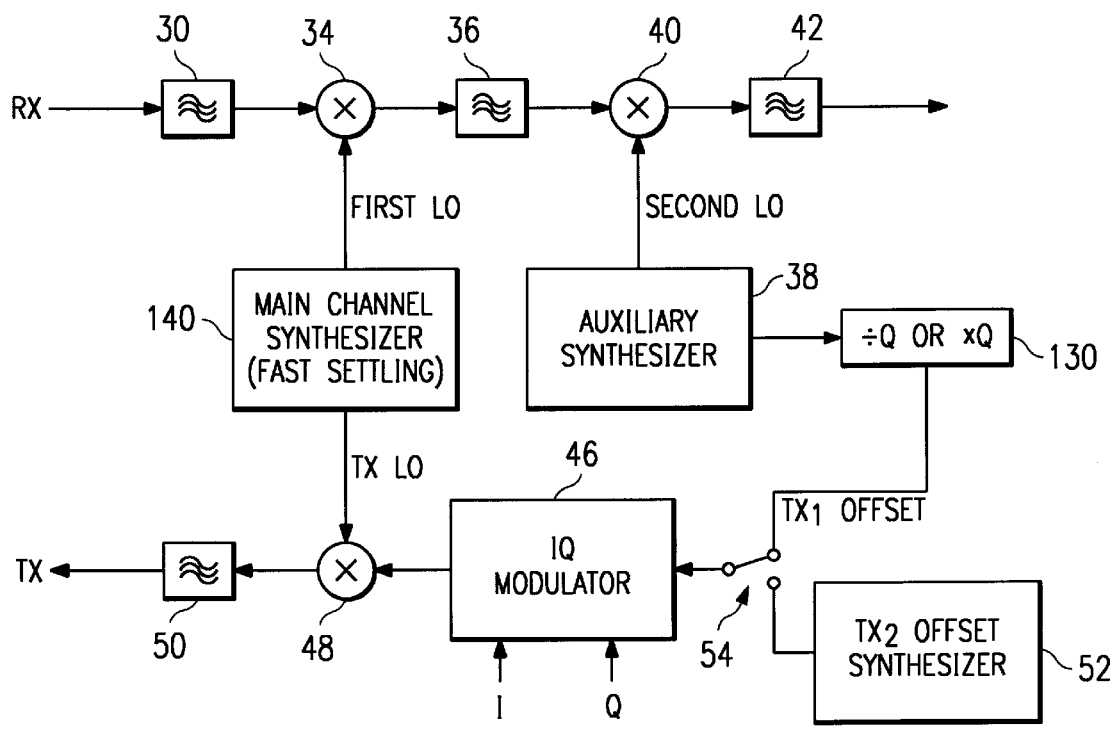
FIG. 11 is a block diagram of an alternative embodiment of the transceiver shown in FIG. 7.

As will be readily recognized by those skilled in the art, many modifications and variations may be made to the foregoing embodiments of the present invention without substantially departing from the spirit and scope of the teachings disclosed herein. One such modification is shown in FIG. 11 in which two transmit offset signals are used. The first transmit offset signal is derived from the auxiliary synthesizer 38 through the scaling circuit 130, as shown in FIG. 7. The second transmit offset signal, on the other hand, is derived from the transmit offset synthesizer 52, as shown in FIG. 5. Although one transmit offset synthesizer is used in this arrangement, there is no need for another transmit offset synthesizer as required in the prior art (FIG. 5).

It will be further recognized that the transmit offset synthesizer 44 in FIG. 4 also may be eliminated by deriving the transmit offset signal from the auxiliary synthesizer 38 in accordance with the present invention. Thus, the present invention can reduce circuit complexity and cost both for single band and dual band operation.

In addition, it will be recognized that the technique of lowering the frequency of the input signal to the frequency divider 160, as taught by the present invention, may be used to reduce the settling time of the main VCO 158 (by using a wider-bandwidth loop filter 172) and/or merely to reduce phase noise at the output of the main VCO 158 (if, for example, the conventional narrower-bandwidth filter 156 is used instead).

In general, it will be appreciated that the forms of the invention disclosed herein are exemplary and are not intended as a limitation on the scope of the present invention, which is defined in the following claims.

I claim:

1. A radio frequency (RF) transceiver comprising:
    a first oscillating means for generating a first local oscillator (LO) signal that is hopped between two different frequencies for transmitting and receiving, respectively, said first oscillating means including:
        a main voltage controlled oscillator (VCO) for generating said first LO signal;
        a programmable frequency divider for dividing said first LO signal;
        a phase detector for comparing the output of said frequency divider to a reference frequency signal and for generating a tuning signal to said main VCO based on said comparison;
        a loop filter at the input of said main VCO for filtering said timing signal; and
        means for lowering the frequency of said first LO signal prior to being divided by said frequency divider such that the bandwidth of said loop filter can be selected so as to minimize the settling time of said main VCO without a concurrent increase in output noise when hopping the frequency of said first LO signal between the transmit and receive operations;
    a second oscillating means for generating a second LO signal;
    a first mixing means for combining said first LO signal with a received signal to produce a first intermediate frequency (IF) signal;
    a second mixing means for combining said first IF signal with said second LO signal to produce a second IF signal;
    frequency scaling means for scaling the frequency of said second LO signal to produce a transmit offset signal;
    modulation means for modulating said transmit offset signal with a data signal; and
    a third mixing means for combining said first LO signal with said data modulated signal to produce a transmit RF signal.

2. The RF transceiver of claim 1 wherein said frequency lowering means comprises:
    a fourth mixing means for combining said first LO signal with a predetermined frequency signal to produce a signal having a lower frequency than said first LO signal.

3. The RF transceiver of claim 2 wherein each of said first, second, third and fourth mixing means comprises a mixer and a filter.

4. The RF transceiver of claim 2 wherein said predetermined frequency signal is derived from said second LO signal.

5. The RF transceiver of claim 2 wherein said predetermined frequency signal is derived from a reference frequency generator.

6. The RF transceiver of claim 1 wherein said scaling means comprises a frequency divider.

7. The RF transceiver of claim 1 wherein said scaling means comprises a frequency multiplier.

8. The RF transceiver of claim 1 wherein said data signal comprises in-phase (I) and out-of-phase (Q) modulation waveforms representative of a speech signal.

9. The RF transceiver of claim 1 wherein said received signal is in the 810–828 MHz range and said transmit signal is in the 940–958 MHz range, and wherein the center frequencies of said received and transmit signals are separated by 130 MHz.

10. The RF transceiver of claim 1 wherein said received signal is in the 870–885 MHz range and said transmit signal is in the 925–940 MHz range, and wherein the center frequencies of said received and transmit signals are separated by 55 MHz.

11. The RF transceiver of claim 1 wherein said received and transmit signals are in the first or second RF bands defined according to the Personal Digital Cellular (PDC) standard.

12. A mobile station comprising:
    means for receiving a radio frequency (RF) signal;
    means for processing an analog signal into a data signal;
    a main channel synthesizer for generating a first local oscillator (LO) signal that is hopped between two different frequencies for transmitting and receiving, respectively, said main channel synthesizer including:
        a main voltage controlled oscillator (VCO) for generating said first LO signal;
        a programmable frequency divider for dividing said first LO signal;
        a phase detector for comparing the output of said frequency divider to a reference frequency signal and for generating a tuning signal to said main VCO based on said comparison;
        a loop filter at the input of said main VCO for filtering said tuning signal; and
        means for lowering the frequency of said first LO signal prior to being divided by said frequency divider such that the bandwidth of said loop filter can be selected so as to minimize the settling time of said main VCO without a concurrent increase in output noise when hopping the frequency of said first LO signal between the transmit and receive operations;
    an auxiliary synthesizer for generating a second LO signal;
    a first mixing means for combining said first LO signal with said received RF signal to produce a first intermediate frequency (IF) signal;
    a second mixing means for combining said first IF signal with said second LO signal to produce a second IF signal;
    frequency scaling means for scaling the frequency of said second LO signal to produce a transmit offset signal;
    modulation means for modulating said transmit offset signal with said data signal; and
    a third mixing means for combining said first LO signal with said data modulated signal to produce a transmit RF signal.

13. The mobile station of claim 12 wherein said frequency lowering means comprises:
    a fourth mixing means for combining said first LO signal with a predetermined frequency signal to produce a signal having a lower frequency than said first LO signal.

14. The mobile station of claim 13 wherein each of said first, second, third and fourth mixing means comprises a mixer and a filter.

15. The mobile station of claim 13 wherein said predetermined frequency signal is derived from said second LO signal.

16. The mobile station of claim 13 wherein said predetermined frequency signal is derived from a reference frequency generator.

17. The mobile station of claim 12 wherein said scaling means comprises a frequency divider.

18. The mobile station of claim 12 wherein said scaling means comprises a frequency multiplier.

19. The mobile station of claim 12 wherein said data signal comprises in-phase (I) and out-of-phase (Q) modulation waveforms representative of a speech signal.

20. The mobile station of claim 12 wherein said received signal is in the 810–828 MHz range and said transmit signal is in the 940–958 MHz range, and wherein the center frequencies of said received and transmit signals are separated by 130 MHz.

21. The mobile station of claim 12 wherein said received signal is in the 870–885 MHz range and said transmit signal is in the 925–940 MHz range, and wherein the center frequencies of said received and transmit signals are separated by 55 MHz.

22. The mobile station of claim 12 wherein said received and transmit signals are in the first or second RF bands defined according to the Personal Digital Cellular (PDC) standard.

23. A method for transceiving radio frequency (RF) signals in a mobile station comprising the steps of:
generating a first local oscillator (LO) signal that is hopped between two different frequencies for transmitting and receiving, respectively, said first LO signal being generated in a voltage controlled oscillator (VCO) that is in a phase locked loop (PLL) with a frequency divider, a phase detector and a loop filter;
lowering the frequency of said first LO signal prior to being divided by said frequency divider such that the bandwidth of said loop filter can be selected so as to minimize the settling time of said VCO without a concurrent increase in output noise when hopping the frequency of said first LO signal between the transmit and receive operations;
generating a second LO signal;
mixing said first LO signal with a received RF signal to produce a first intermediate frequency (IF) signal;
mixing said first IF signal with said second LO signal to produce a second IF signal;
scaling the frequency of said second LO signal to produce a transmit offset signal;
modulating said transmit offset signal with a data signal; and
mixing said first LO signal with said data modulated signal to produce a transmit RF signal.

24. The method of claim 23 wherein said first LO signal is input to a mixer in the PLL and mixed with a predetermined frequency signal to produce a signal having a lower frequency than said first LO signal, the lower frequency signal being then divided in the frequency divider, the output of the frequency divider being compared with a reference frequency signal input to the phase detector, and the output of the phase detector being filtered in the loop filter and then provided to the VCO.

25. The method of claim 24 wherein said predetermined frequency signal is derived from said second LO signal.

26. The method of claim 24 wherein each of said predetermined frequency signal and said reference frequency signal is derived from a reference frequency generator in said mobile station.

27. The method of claim 23 wherein said scaling step comprises frequency division.

28. The method of claim 23 wherein said scaling step comprises frequency multiplication.

29. The method of claim 23 wherein said data signal comprises in-phase (I) and out-of-phase (Q) modulation waveforms representative of a speech signal.

30. The method of claim 23 wherein said received signal is in the 810–828 MHz range and said transmit signal is in the 940–958 MHz range, and wherein the center frequencies of said received and transmit signals are separated by 130 MHz.

31. The method of claim 23 wherein said received signal is in the 870–885 MHz range and said transmit signal is in the 925–940 MHz range, and wherein the center frequencies of said received and transmit signals are separated by 55 MHz.

32. The method of claim 23 wherein said received and transmit signals are in the first or second RF bands defined according to the Personal Digital Cellular (PDC) standard.

* * * * *